United States Patent
Xiao et al.

(10) Patent No.: US 8,912,545 B2
(45) Date of Patent: Dec. 16, 2014

(54) NANOWIRES, NANOWIRE FIELDE-EFFECT TRANSISTORS AND FABRICATION METHOD

(71) Applicant: Semiconductor Manufacturing International Corp., Shanghai (CN)

(72) Inventors: Deyuan Xiao, Shanghai (CN); James Hong, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/832,648

(22) Filed: Mar. 15, 2013

(65) Prior Publication Data

US 2014/0151705 A1 Jun. 5, 2014

(30) Foreign Application Priority Data

Dec. 4, 2012 (CN) .......................... 2012 1 0513894

(51) Int. Cl.
| | |
|---|---|
| *H01L 29/66* | (2006.01) |
| *H01L 21/3205* | (2006.01) |
| *H01L 29/78* | (2006.01) |
| *B82Y 40/00* | (2011.01) |
| *B82Y 10/00* | (2011.01) |
| *H01L 29/775* | (2006.01) |
| *H01L 29/06* | (2006.01) |

(52) U.S. Cl.
CPC ................. *H01L 29/78* (2013.01); *B82Y 40/00* (2013.01); *H01L 29/66522* (2013.01); *B82Y 10/00* (2013.01); *H01L 29/66439* (2013.01); *H01L 29/775* (2013.01); *H01L 29/0673* (2013.01); *Y10S 977/763* (2013.01); *Y10S 977/89* (2013.01); *Y10S 977/938* (2013.01)

USPC ............. 257/64; 438/150; 438/166; 977/763; 977/890; 977/938

(58) Field of Classification Search
CPC ........................... H01L 29/66; H01L 21/3205
USPC ........ 257/9, E29.166, E21.294, 50, 665, 529, 257/530, 1–5; 438/597, 466, 785
See application file for complete search history.

(56) References Cited

U.S. PATENT DOCUMENTS

| | | | | |
|---|---|---|---|---|
| 7,274,051 | B2 * | 9/2007 | Kim et al. ..................... | 257/213 |
| 7,374,986 | B2 * | 5/2008 | Kim et al. ..................... | 438/193 |
| 2006/0216897 | A1 * | 9/2006 | Lee et al. ...................... | 438/282 |
| 2007/0238314 | A1 * | 10/2007 | Buretea et al. ................ | 438/775 |
| 2009/0311835 | A1 * | 12/2009 | Chu et al. ..................... | 438/151 |
| 2011/0012176 | A1 * | 1/2011 | Chidambarrao et al. ..... | 257/255 |
| 2011/0133162 | A1 * | 6/2011 | Bangsaruntip et al. ........ | 257/24 |

FOREIGN PATENT DOCUMENTS

JP 62257761 * 11/1987

* cited by examiner

*Primary Examiner* — Steven Loke
*Assistant Examiner* — Didarul Mazumder
(74) *Attorney, Agent, or Firm* — Anova Law Group, PLLC (57) ABSTRACT

A method is provided for fabricating a nanowire-based semiconductor structure. The method includes forming a first nanowire with a first polygon-shaped cross-section having a first number of sides. The method also includes forming a semiconductor layer on surface of the first nanowire to form a second nanowire with a second polygon-shaped cross-section having a second number of sides, the second number being greater than the first number. Further, the method includes annealing the second nanowire to remove a substantial number of vertexes of the second polygon-shaped cross-section to form the nanowire with a non-polygon-shaped cross-section corresponding to the second polygon-shaped cross-section.

14 Claims, 8 Drawing Sheets

NANOWIRES, NANOWIRE FIELDE-EFFECT TRANSISTORS AND FABRICATION METHOD

CROSS-REFERENCES TO RELATED APPLICATIONS

This application claims the priority of Chinese patent application No. 201210513894.5, filed on Dec. 4, 2012, the entirety of which is incorporated herein by reference.

FIELD OF THE INVENTION

The present invention generally relates to the field of semiconductor manufacturing technology and, more particularly, relates to techniques for fabricating nanowires and nanowire field-effect transistors.

BACKGROUND

In order to follow the Moore's law, the feature sizes of semiconductor devices (for example, field-effect transistors) have been continuously shrinking. The switching characteristic of the transistors may become worse because of the short-channel effects and leakage current problem of a channel under the shrunk feature size. Therefore, improving the performance of the conventional field-effect transistors by shrinking their physical sizes has encountered some difficulties.

Figure 1:
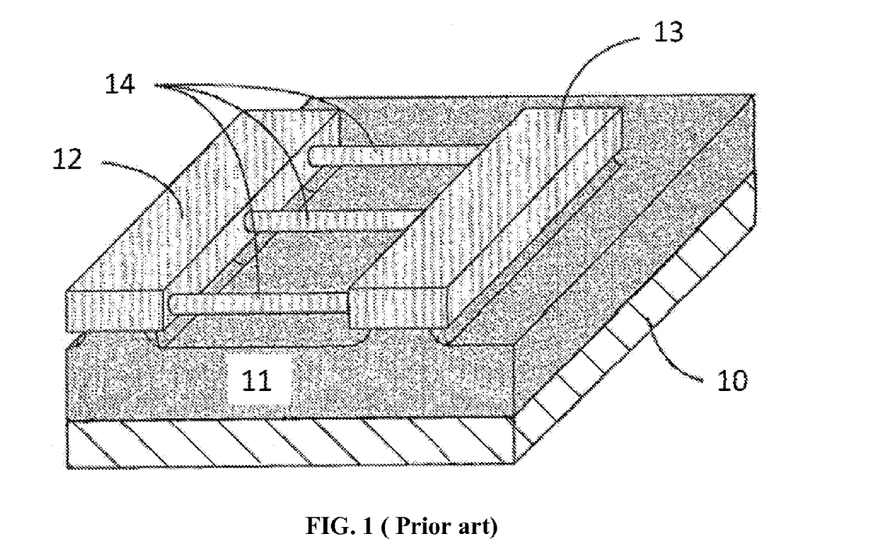
FIG. 1 illustrates an existing nanowire field-effect transistor.

Nanowire field-effect transistors (NWFETs) have been developed by existing technologies. FIG. 1 illustrates an existing NWFET. The NWFET includes a silicon substrate 10, and an oxide buried layer 11 on the silicon substrate 10. The NWFET also includes a plurality of convex structures on the oxide buried layer 11. Further, the NWFET includes a first pad region 12 and a second pad region 13 on the convex structures. Further, the NWFET also includes a plurality of nanowires 14 suspending between the first pad region 12 and the second pad region 13. The first pad region 12 and the second pad region 13 are used for subsequently forming a source region and a drain region. The nanowires 14 are used as channel regions. A surrounding gate structure (not shown) may be formed to cover the nanowires 14.

The nanowires 14 are used as channel regions in the NWFET, carriers in the nanowire channels may be away from surfaces of the nanowires 14 because of the quantum confinement effect, thus carrier transportations in the nanowire channels may be less affected by a surface scattering and a lateral electric field. Therefore, a relatively high carrier mobility may be obtained. Further, because the NWFET may have a relatively small channel, and a surrounding gate structure may be used as a gate structure, the modulating ability of the gate structure may be enhanced, and the threshold characteristics may be improved. Therefore, the short-channel effects may be effectively restrained, and the size of a field-effect transistor may be further shrunk. Further, because the surrounding gate structure of a NWFET may enhance the modulating ability of the gate structure of the NWFET, the requirement for thinning the gate dielectric layer may be alleviated.

However, how to optimize the performance of a NWFET is still one of urgent tasks for those skilled in the art. The disclosed methods and systems are directed to solve one or more problems set forth above and other problems.

BRIEF SUMMARY OF THE DISCLOSURE

One aspect of the present disclosure includes a method for fabricating a nanowire based semiconductor structure. The method includes forming a first nanowire with a first polygon-shaped cross-section having a first number of sides. The method also includes forming a semiconductor layer on surface of the first nanowire to form a second nanowire with a second polygon-shaped cross-section having a second number of sides, the second number being greater than the first number. Further, the method includes annealing the second nanowire to remove a substantial number of vertexes of the second polygon-shaped cross-section to form the nanowire with a non-polygon-shaped cross-section corresponding to the second polygon-shaped cross-section.

Another aspect of the present disclosure includes a nanowire field-effect transistor. The nanowire field-effect transistor includes a semiconductor substrate having a first substrate and a buried layer. The nanowire field-effect transistor also includes a nanowire having a circular cross-section. Further, the nanowire field-effect transistor includes a source region and a drain region. Further, the nanowire field-effect transistor also includes a surrounding gate structure having a gate dielectric layer and a metal gate layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

According to extensive investigations, a leakage current may be lowered in a nanowire field-effect transistor if a surface of the nanowire is smoothed. An anneal process may be used to smooth the surface of the nanowire, which may refer as a rounding process. Time of the annealing process may be reduced if the nanowire has a polygon cross-section. Therefore, the performance of the nanowire field-effect transistor may be enhanced, and the fabrication process may be simplified simultaneously if a nanowire with the polygon cross-section is formed before the annealing process.

Figure 2:
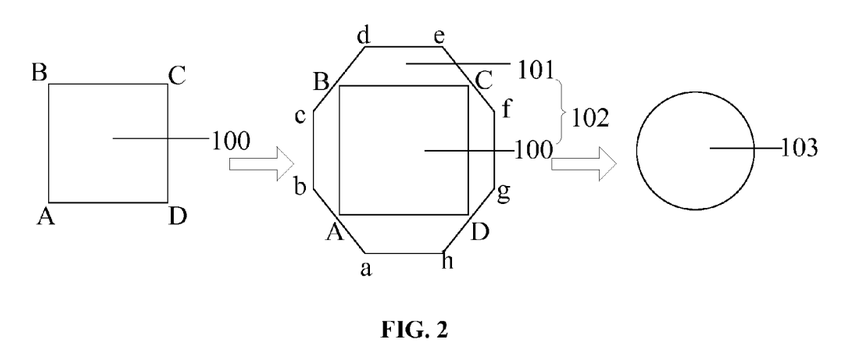
FIG. 2 illustrates semiconductor structures corresponding to certain stages of an exemplary fabrication process for a nanowire consistent with certain disclosed embodiments.
Figure 3:
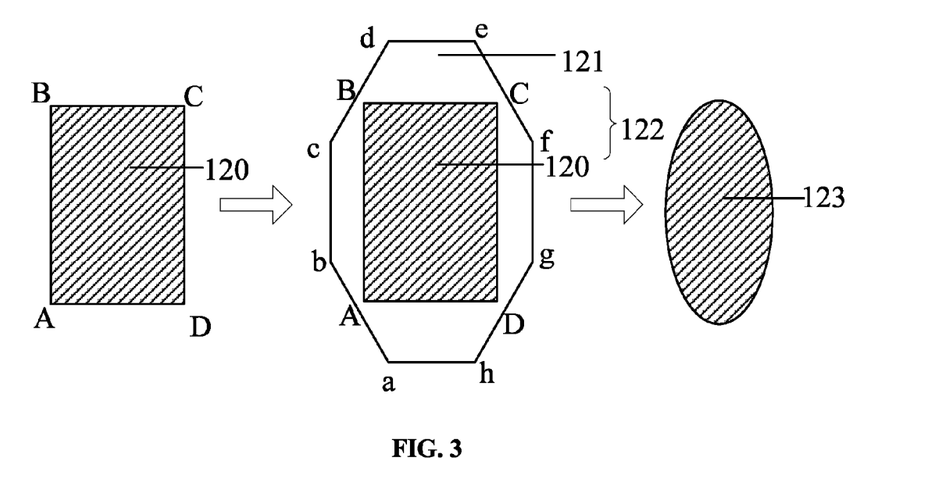
FIG. 3 illustrates semiconductor structures corresponding to certain stages of an exemplary fabrication process for a nanowire consistent with certain disclosed embodiments.
Figure 4:
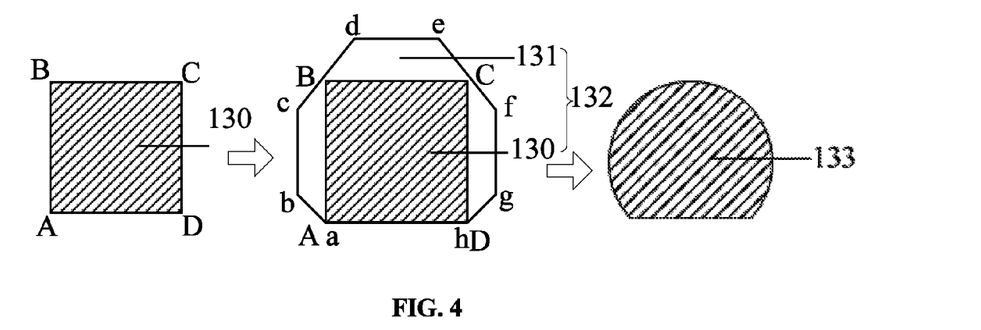
FIG. 4 illustrates semiconductor structures corresponding to certain stages of an exemplary fabrication process for a nanowire consistent with certain disclosed embodiments.
Figure 13:
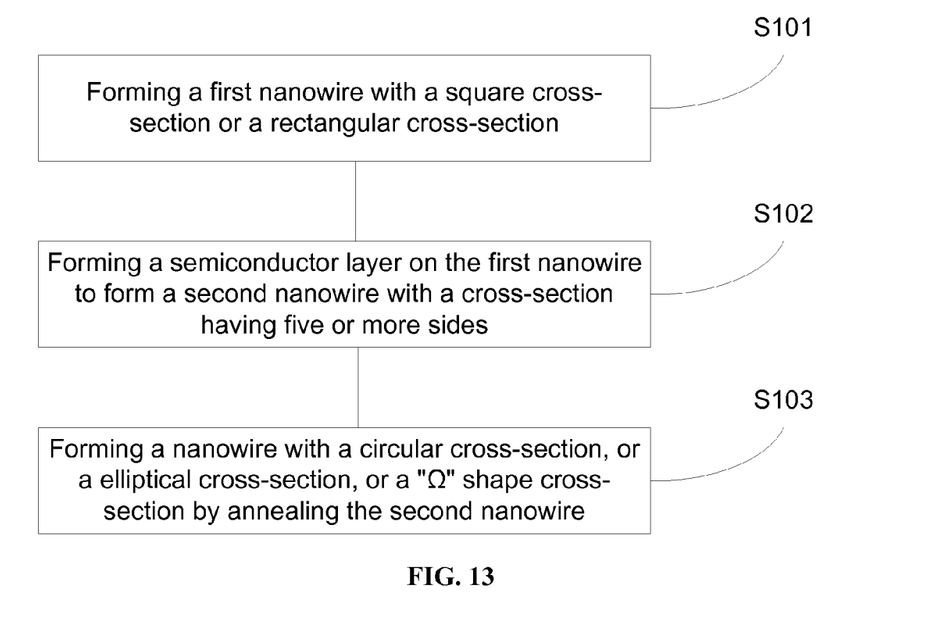
FIG. 13 illustrates an exemplary fabrication process for a nanowire consistent with the disclosed embodiments.

FIG. 13 illustrates an exemplary fabrication process for a nanowire, and FIGS. 2-4 illustrate semiconductor structures corresponding certain stages of the exemplary fabrication process for a nanowire consistent with certain disclosed embodiments.

As shown in FIG. 13, at the beginning of the fabrication process, a first nanowire 100 may be formed to provide a substrate for subsequently forming a semiconductor layer (S101). The left image in FIG. 2 illustrates a corresponding semiconductor structure. The first nanowire 100 may have different cross-sections, such as a square cross-section, a rectangular cross-section, a triangle cross-section, or a hexagonal cross-section, etc. In one embodiment, the first nanowire 100 has a square cross-section. The first nanowire 100 may have a (−100) crystal face AD, a (100) crystal face BC, a (0-10) crystal face AB, and a (010) face CD, which may provide surfaces for subsequently epitaxially growing a semiconductor layer, and prevent crystal defects being formed.

The first nanowire 100 may be made of any appropriate semiconductor material, such as silicon, germanium, silicon germanium, carborundum, indium antimonide, lead telluride, indium arsenide, indium phosphide, gallium arsenide, gallium antimonide, or any other III-V, II-VI compound semiconductors. The first nanowire 100 may also be made of other appropriate material, such as piezoelectric material or metal material, etc.

Various processes may be used to form the first nanowire 100, such as a microfabricaiton process, a nanofabrication process, a chemical vapor deposition process, or wet chemical process, etc. In one embodiment, the first nanowire 100 is formed by a microfabrication process. The microfabrication process for forming the first nanowire 100 may include sequentially: forming a first semiconductor layer, patterning the first semiconductor layer using a photo lithography process, and etching the first semiconductor layer to form the first nanowire 100 with a square cross-section.

Returning to FIG. 13, after forming the first nanowire 100, a semiconductor layer may be formed on the surfaces of the first nanowire 100 (S102). The middle image in FIG. 2 illustrates a corresponding semiconductor structure.

As shown in the middle image in FIG. 2, a semiconductor layer 101 is formed on the surfaces of the first nanowire 100. The semiconductor layer 101 may cover all the four surfaces of the first nanowire 100, which includes the (−100) crystal face AD, the (100) crystal face BC, the (0-10) crystal face AB, and the (010) crystal face CD. A contour of the semiconductor layer 101 may be an octagon, thus a cross-section of a finally obtained second nanowire 102 consisting of the first nanowire 100 and the semiconductor layer 101 may be in an octagon shape too.

In one embodiment, the semiconductor layer 102 may be made of a same material as the first nanowire 100, such as silicon, germanium, silicon germanium, carborundum, indium antimonide, lead telluride, indium arsenide, indium phosphide, gallium arsenide, gallium antimonide, piezoelectric material, metal material or any other III-V, II-VI compound semiconductors, etc. If the semiconductor layer 102 and the first nanowire 100 are made of a same material, crystal lattices may be well matched, thus crystal defects may be prevented. Further, types of materials may be reduced, the production cost may be lowered. In certain other embodiments, the semiconductor layer 102 may also be made of a material different from the first nanowire 100.

The semiconductor layer 102 may be formed by various processes, such as a chemical vapor deposition process, an atomic layer deposition process, a selective epitaxial growth process, or a wet chemical process, etc. In one embodiment, the semiconductor layer 102 is formed by a selective epitaxial growth process. Specifically, a semiconductor material may be deposited on the (−100) crystal face AD, and a new (−100) crystal face 'ah' may be formed; the semiconductor material may be deposited on the (100) crystal face BC, and a new (100) crystal face de may be formed; the semiconductor material may be deposited on the (0-10) crystal face AB, and a new (0-10) crystal face 'bc' may be formed; and the semiconductor material may be deposited on the (010) crystal face CD, and a new (010) crystal face 'gf' may be formed. The semiconductor material may be deposited on the four crystal faces including AB, BC, CD, and AD simultaneously.

In addition, a (−1-10) crystal face 'ab' may be formed between the (−100) crystal face ah and the (0-10) crystal face 'bc'; a (1-10) crystal face 'cd' may be formed between the (0-10) crystal face 'bc' and the (100) crystal face 'de'; a (110) crystal face 'ef' may be formed between the (100) crystal face 'de' and the (010) crystal face 'fg'; and a (−110) crystal face 'gh' may be formed between the (010) crystal face 'fg' and the (−100) crystal face 'ah'. The crystal faces 'ab', 'cd', 'gh', and 'ef' may be formed simultaneously with depositing the semiconductor material.

A growth rate of the semiconductor material at different crystal faces may be controlled to cause the growth rate at the (100) crystal face, the (−100) crystal face, the (010) crystal face and the (0-10) crystal face to be greater than the growth rate at the (110) crystal face, the (−110) crystal face, the (−1-10) crystal face and the (1-10) crystal face. Therefore, the second nanowire 102 with the octagonal cross-section shown in the middle image in FIG. 2 may be formed.

Returning to FIG. 13, after forming the second nanowire 102, a thermal annealing process may be performed to form a third nanowire (S103). The right picture in FIG. 2 illustrates a corresponding semiconductor structure.

As shown in the right picture in FIG. 2, a third nanowire 103 is formed after a thermal annealing process. The third nanowire 103 may be formed by smoothing the surface of the second nanowire 102 using the thermal annealing process. The thermal annealing process for forming the third nanowire 103 may refer to a rounding process. After the rounding process, the nanowire 103 may have a near circular surface.

The second nanowire 102 having the octagonal section may be annealed in a helium, hydrogen, or deuterium environment at a temperature greater than approximately 900° C., i.e., the rounding process, the surface of the second nanowire 102 may be smoothed, and the cylindrical third nanowire 103 with the circular cross-section may be formed. Other appropriate gas may also be used in the annealing process. If the cylindrical third nanowire 103 is used as a channel of a transistor, a leakage current may be reduced, and a carrier mobility may be increased.

Compared to the first nanowire 100 with the square cross-section, the octagonal cross-section of the second nanowire 102 may be more similar with a circular shape, thus the annealing may be relatively short. Therefore, a fabrication process for a nanowire may be simplified.

Optionally and additionally, at least one oxidization process and one etching process may be performed to cause the cross-section of the third nanowire 103 more close to a theoretical circle, i.e., having an uniform radius. Referring to the middle picture in FIG. 2, during the oxidization process a contact angle between oxygen and vertex angles of the octagon may be greater than a contact angle between oxygen and sides of the octagon, an area exposed in oxygen at the vertex angles may be relatively large, thus an oxidized thickness of the vertex angles may be relatively large too. During the etching process, the oxidized portion of the third nanowire 103 may be removed. Therefore, the oxidized portion at the vertex angles may be removed more than the oxidized portion at the sides, the vertex angles of the octagon may be gradually rounded, and the cross-section of the third nanowire 103 may be more close to a circle.

Various processes may be used to oxidize the third nanowire 103, such as a thermal oxidation process, a chemical oxidation process, or a plasma oxidation process, etc. In one embodiment, the first nanowire 100 and the semiconductor material 101 may be made of silicon, thus the second nanowire 102 and the third nanowire 103 may be made of silicon. A thermal oxidation process may be used to oxidize a surface portion of the third nanowire 103.

After oxidizing the third nanowire 103, a diluted hydrogen fluoride solution may be used to removed silicon oxide layer on the surface of the third nanowire 103, thus the cross-section of the third nanowire 103 may be more close to a circle. Other appropriate process may also be used to remove the oxide layer, such as a plasma etching process, or other wet chemical etching process.

FIG. 3 illustrates another process for forming a nanowire. The process for forming a nanowire shown in FIG. 3 is similar to the process shown in FIG. 2.

Certain differences includes, referring to the left image in FIG. 2, a first nanowire 120 with a rectangular cross-section, i.e., lengths of a side AB and a side CD may be greater than lengths of a side AD and a side BC. The side AB may correspond to a (−100) crystal face; the side CD may correspond to a (100) crystal face; the side AD may correspond to a (0-10) crystal face; and the side BC may correspond to a (010) crystal face.

After forming a semiconductor material 121 covering the first nanowire 120, referring to the middle image in FIG. 3, a second nanowire 122 may be formed. A cross-section of the second nanowire 122 is a vertically extended octagon because the lengths of the side AB and the side CD may be greater than the lengths of the side AD and the side BC. A process for forming the semiconductor material 121 may be similar to S102 shown in FIG. 13 described above.

Further, referring to the right image in FIG. 3, after forming the second nanowire 122 with the rectangular cross-section, a third nanowire 123 may be formed by an annealing process. A cross-section of the third nanowire 123 may be elliptical because the cross section of the second nanowire 122 is rectangular. The third nanowire 123 having the elliptical cross-section may have a smooth surface. When the third nanowire 123 is used as a channel of a transistor, a leakage current may be reduced, and a carrier mobility may be increased. A process for forming the third nanowire 123 may be similar to S103 in FIG. 13 described above.

FIG. 4 illustrates another process for forming a nanowire. The process for forming a nanowire shown in FIG. 4 is similar to the process shown in FIG. 2.

Certain differences may include, after forming the first nanowire 130, a semiconductor layer 131 may be only formed on the surface AB, the surface BC, and the surface CD of the first nanowire 130. The surface AD is not covered by the semiconductor layer 131. A cross-section of the first nanowire 130 may be square or rectangular. A process for forming the semiconductor material 131 may be similar to S102 shown in FIG. 13 described above. A semiconductor material may selectively grow on a portion of the surface of the first nanowire 130, i.e, the surface AB, the surface BC, and the surface CD. The surface AD may be covered by a substrate if the first nanowire 130 lays on the substrate. The surface may be also covered by appropriate sacrificial material which may be removed after forming the semiconductor layer 131.

Further, referring to the right image in FIG. 4, a third nanowire 133 may be formed by smoothing the surface of the second nanowire 132 having the first nanowire 130 and the semiconductor layer 131 using a thermal annealing process. The third nanowire 133 may have a "Ω" shape cross-section. The third nanowire 133 having the a "Ω" shape cross-section may have a smooth surface. When the third nanowire 133 is used as a channel of a transistor, a leakage current may be reduced, and a carrier mobility may be increased. A process for forming the third nanowire 133 may be similar to S103 in FIG. 13 described above In certain other embodiments, the semiconductor layer 131 may cover only one or two of the faces of the first nanowire 130, the third nanowire 133 with different cross-sections and a smooth surface may be formed after the thermal anneal process. When the third nanowire 133 is used as a channel of a transistor, a leakage current may be reduced, and a carrier mobility may be increased.

In certain other embodiments, a cross-section of a second nanowire having a first nanowire and a semiconductor layer may be any type of polygonal, such as pentagonal, hexagonal, decagonal, or hex decagonal, etc. The second nanowire with a polygonal cross-section of may be formed by controlling the grate rate of the semiconductor layer at different crystal faces.

Figure 9:
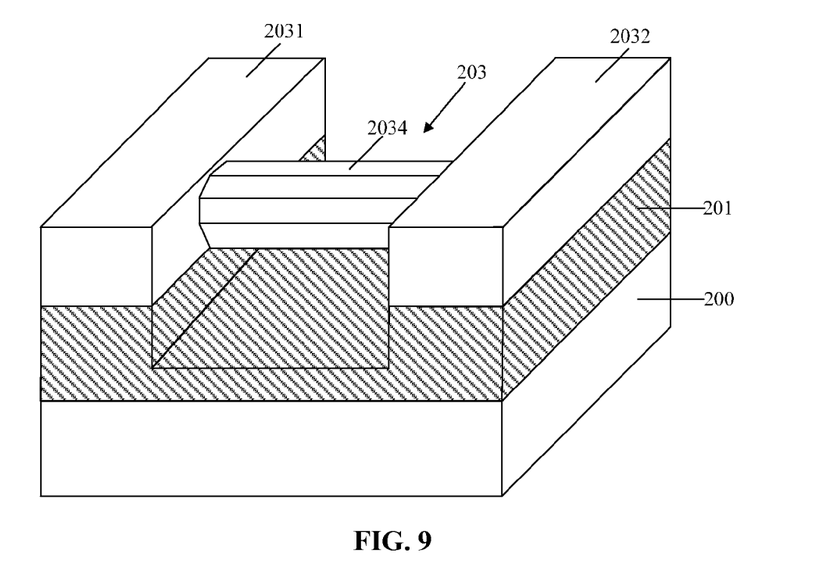
Figure 10:
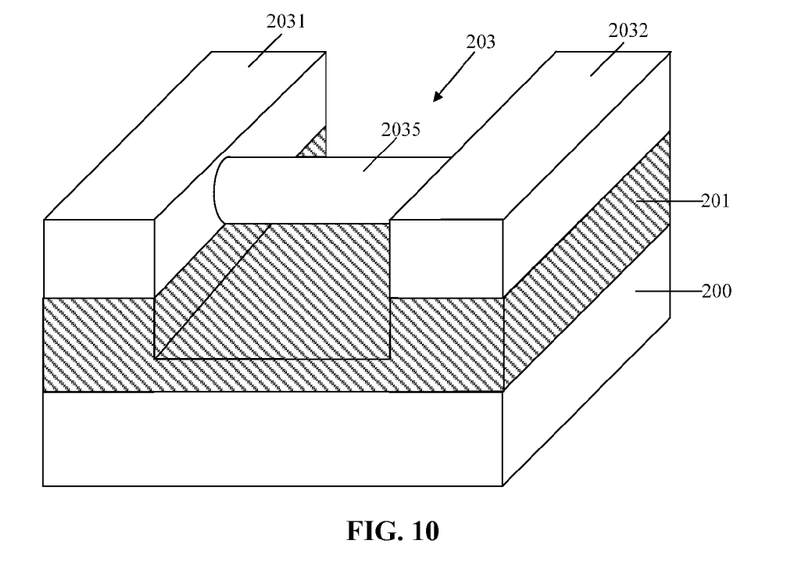
Figure 11:
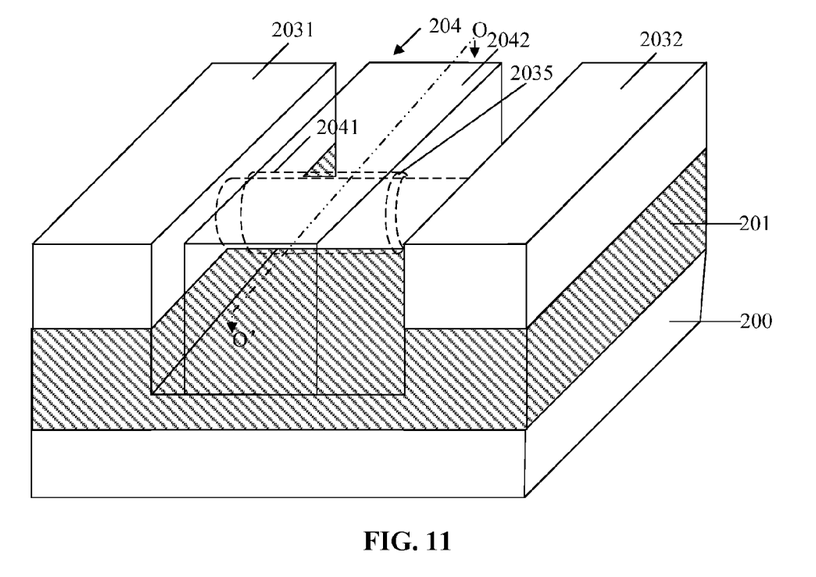
Figure 12:
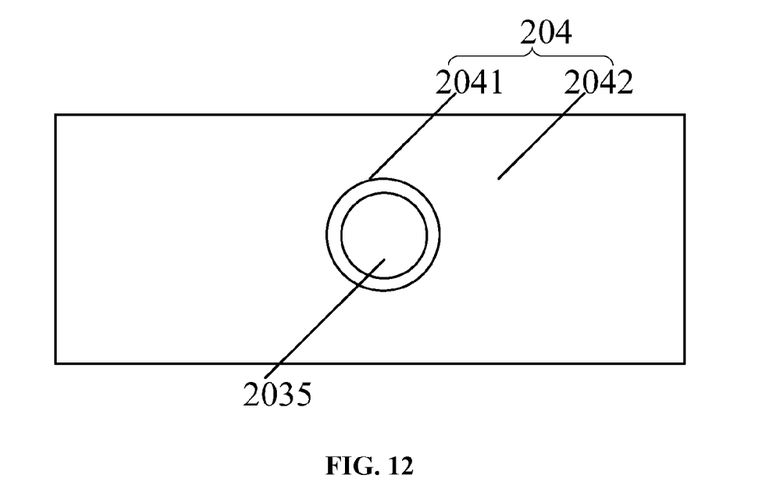
FIG. 12 illustrates a semiconductor structure corresponding a cross-section view of the semiconductor structure shown in FIG. 11 along the OO' direction.
Figure 14:
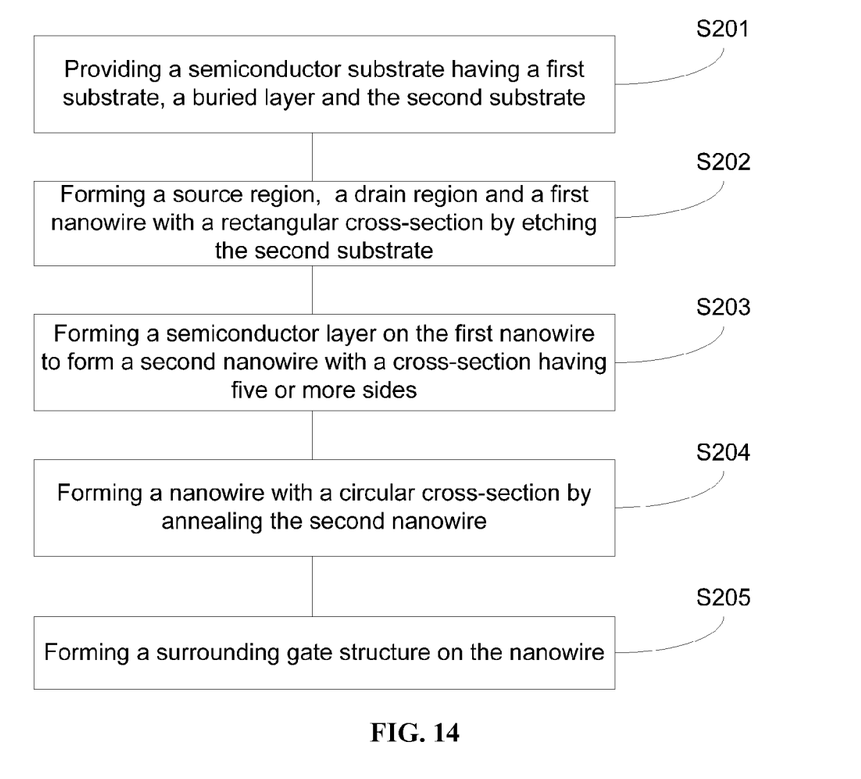
FIG. 14 illustrates an exemplary fabrication process for a nanowire field-effect transistor consistent with the disclosed embodiment.

FIG. 14 illustrates an exemplary fabrication process for a nanowire field-effect transistor consistent with the disclosed embodiments, FIGS. 5-11 illustrate semiconductor structures corresponding to certain stages of an exemplary fabrication process for a nanowire field-effect transistor consistent with the disclosed embodiments, and FIG. 12 illustrates a semiconductor structure corresponding to a cross-section view of the semiconductor structure shown in FIG. 11 along the OO' direction.

Figure 5:
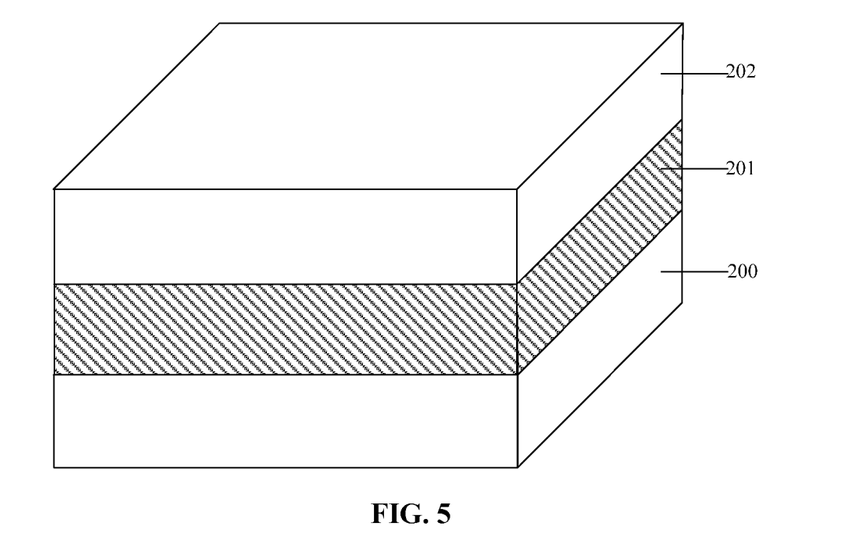
FIGS. 5-11 illustrate semiconductor structures corresponding to certain stages of an exemplary fabrication process for a nanowire field-effect transistor consistent with the disclosed embodiments.

As shown in FIG. 14, at the beginning of the fabrication process, a semiconductor substrate with certain structures is provided (S201). FIG. 5 illustrates a corresponding semiconductor device.

As shown in FIG. 5, a semiconductor substrate is provided. The semiconductor substrate may have a first substrate 200, a buried layer 201, and a second substrate 202. The first substrate 200, the buried layer 201 and the second substrate 202 may be made of a same material or different materials. The first substrate 200, the buried layer 201 and the second substrate 202 may include any appropriate material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials. The first substrate 200, the buried layer 201 and the second substrate 202 may also include any other appropriate material.

In one embodiment, the first substrate 200 is silicon, the buried layer 201 is an oxide layer, and the second substrate 202 is silicon having a (100) crystal face. In another embodiment, the first substrate 200 is silicon, the buried layer 201 is silicon germanium, and the second substrate 202 is silicon with a (100) crystal face. The buried layer 201 made of silicon germanium and the second substrate 202 made of silicon may have different selective etching ratios, which may help to subsequently form a first nanowire.

Figure 6:
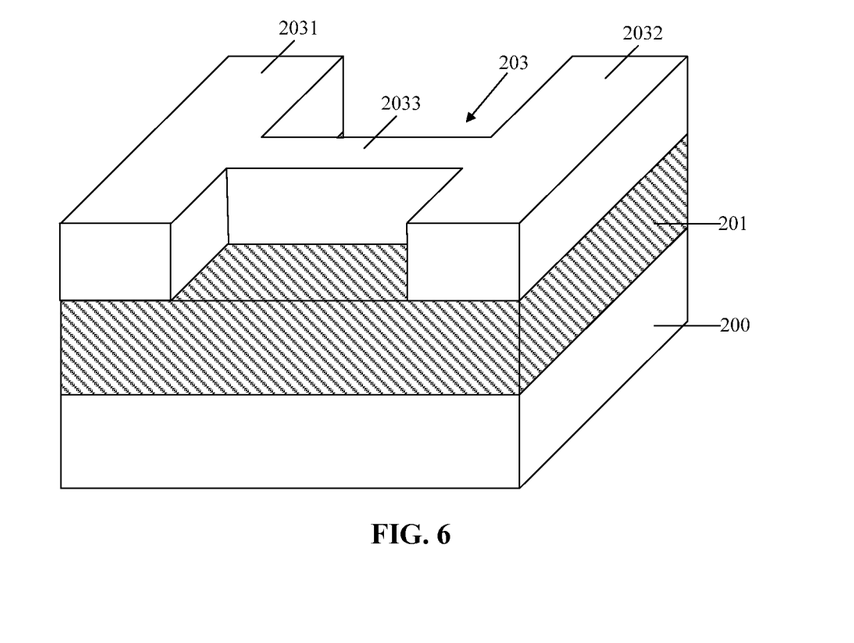

Returning to FIG. 14, after providing the semiconductor substrate, the second substrate 202 (may refer to the second silicon substrate if the second substrate 202 is made of silicon) may be patterned to form a source region, a drain region, and a first nanowire (S202). FIG. 6 illustrates a corresponding semiconductor structure.

As shown in FIG. 6, an "H" shape structure 203 is formed by patterning the second substrate 202. Two parallel stripe regions of the "H" shape structure 203 may be a source region 2031 and a drain region 2032. A structure with a square cross-section between the source region 2031 and the drain region 2032 may be a first nanowire 2033. The first nanowire 2033 may have two surfaces (e.g., top and bottom surfaces) which may correspond to a (100) crystal face (top surface) and a (−100) crystal face (bottom surface), respectively. The first nanowire 2033 may also have two side surfaces which may correspond to a (010) crystal face and a (0-10) crystal face, respectively.

Various processes may be used to form the first nanowire 2033, such as a dry etching process including a plasma etching process and an ion be etching process, etc, or a wet etching process, etc. In one embodiment, the first nanowire 2033 is formed by patterning the second silicon substrate 202 using a dry etching process.

In certain other embodiments, the first nanowire 2033 may be formed by an epitaxial growth process. Catalysts may be deposited on the second substrate 202, and a first nanowire 2033 may be grown in a lateral direction on the surface of the second substrate 202.

Figure 7:
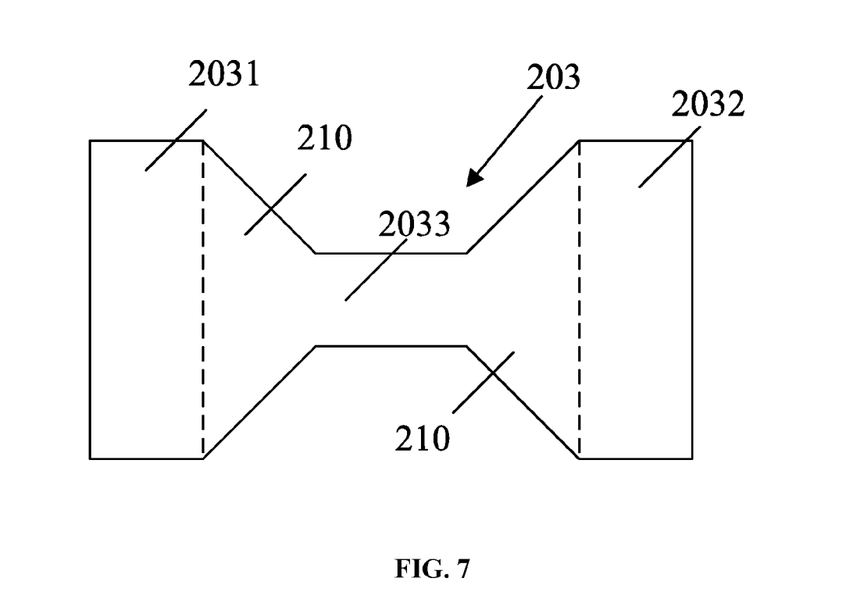

In certain other embodiments, the "H" shape structure 203 may also be a shape shown in FIG. 7. As shown in FIG. 7, there may be two extended trapezoids 210 besides the parallel source region 2031 and drain region 2032. The "H" shape structure 203 may also have other appropriate transfigurations.

Further, after forming the "H" shape structure 203, a portion of the buried layer 201 underneath the first nanowire 2033 may be removed. The corresponding semiconductor structure is illustrated in FIG. 8.

Figure 8:
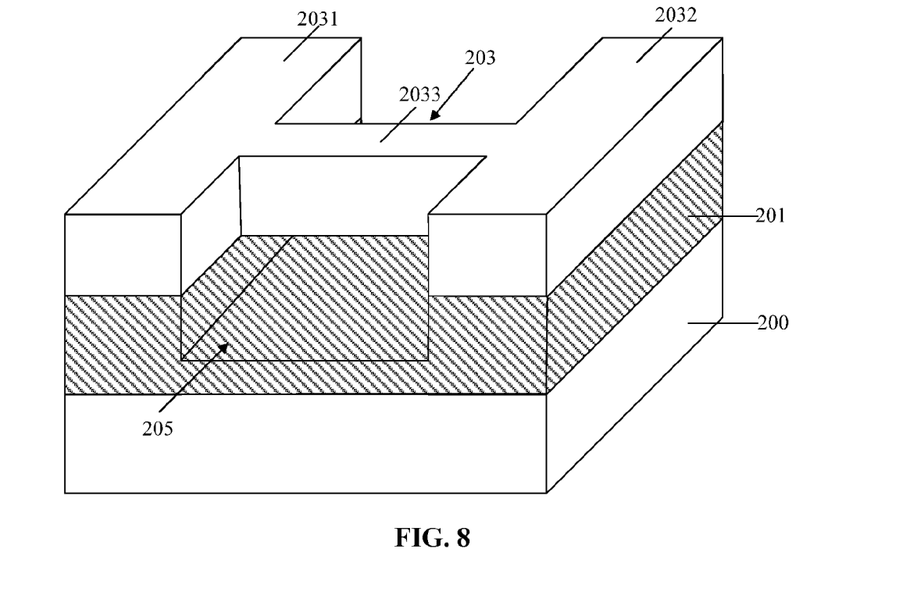

As shown in FIG. 8, a through-hole 205 may be formed after removing the portion of the buried layer 201 underneath the first nanowire 2033. The first nanowire 2033 may be suspended after forming the through-hole 205, a semiconductor layer covering the first nanowire 2033 may be convenient to be formed subsequently. Further, a surrounding gate structure may also be convenient to be formed subsequently. That is, a space (may refer to the through hole 205) may be reserved for subsequently forming the semiconductor layer and the surrounding gate structure on the bottom of the first nanowire 2033.

In certain other embodiments, the portion of the second substrate 201 underneath the first nanowire 2033 may be kept. Thus, a subsequently formed second nanowire may have a "Ω" shape cross section, and a subsequently formed surrounding gate structure may be unable to cover the bottom surface of the first nanowire 2033.

Returning to FIG. 14, after forming the first nanowire 2033, a semiconductor layer may be formed on the first nanowire 2033 to form a second nanowire (S203). FIG. 9 illustrates a corresponding semiconductor structure.

As shown in FIG. 9, a second nanowire 2034 with an octagonal cross-section is formed. The second nanowire 2034 may consist of the first nanowire 2033 and the semiconductor layer.

The semiconductor layer may be formed by any appropriate process, such as a chemical vapor deposition process, an atomic layer deposition process, a selective epitaxial growth process, or a wet chemical process, etc. In one embodiment, the semiconductor layer is formed by a selective epitaxial growth process.

Specifically, the semiconductor material may be deposited on the surfaces of the (100) crystal face, the (−100) crystal face, the (010) crystal face, and the (0-10) crystal face. Therefore, a new (100) crystal face, a new (−100) crystal face, a new (010) crystal face, and a new (0-10) crystal face may be formed. A (110) crystal face, a (1-10) crystal face, a (−110) crystal face, and a (−1-10) crystal face may also be formed simultaneously. Therefore, the cross-section of the second nanowire 2034 may be octagonal. A process for forming the second nanowire 2034 is similar to S102, the detailed descriptions are omitted herein.

Returning to FIG. 14, after forming the second nanowire 2034, a third nanowire with a smooth surface may be formed (S204). FIG. 10 illustrates a corresponding semiconductor structure.

As shown in FIG. 10 a cylindrical third nanowire 2035 is formed. The third nanowire 2035 may be formed by annealing the second nanowire 2034. A thermal annealing process may smooth the surface of the second nanowire 2034, and form a near circular surface, thus the third nanowire 2035 with a circular cross-section may be formed. In certain other embodiment, the cross-section of the third nanowire 2035 may be an elliptical shape or a "Ω" shape if the first nanowire 2033 has other appropriate type of cross-sections, as described previously.

Additionally and optionally, at least one thermal oxidation process and one etching process may be performed after the thermal annealing process. After the thermal oxidation process and the etching process, the third nanowire 2035 may have a near theoretically circular cross-section. The thermal annealing process may use pure oxygen or diluted oxygen as a reaction gas, and heat the substrate with the third nanowire 2035 at a certain temperature. The etching process may be a dry etching process including a plasma etching process or an ion beam etching process, or a wet etching process. In one embodiment, the etching process is a wet etching process.

Returning to FIG. 14, after forming the third nanowire 2035, a gate structure may be formed on the third nanowire 2035 (S205). FIG. 11 illustrates a corresponding semiconductor structure.

As shown in FIG. 11, a gate structure 204 is formed on the third nanowire 2035. The gate structure 204 may include any appropriate form. In one embodiment, the gate structure 204 may be a surrounding gate, i.e., the gate structure 204 may cover an entire surface of the third nanowire 2035. FIG. 12 illustrates a cross-section view of the surrounding gate structure 204 along OO' direction shown in FIG. 11.

As shown in FIG. 12, the surrounding gate structure 204 may have a gate dielectric layer 2041 covering the entire surface of the third nanowire 2035 and a gate layer 2042 covering an entire surface of the dielectric layer 2041. The gate layer 2042 may also cover a portion of one surface of the buried layer 201. In certain other embodiments, if the portion of the buried layer 201 underneath third nanowire 2035 is kept, e.g., the cross-section of the third nanowire 2035 is a "Ω" shape, the surrounding gate structure 204 may be unable to cover a bottom surface of the third nanowire 2035.

The gate dielectric layer 2041 may be a high-K dielectric layer including one or more of hafnium oxide, zirconium oxide, lanthanum oxide, aluminum oxide, titanium oxide, strontium titanate, barium titanate, lanthanum aluminum oxide, yttrium oxide, hafnium oxynitride, zirconium oxynitride, lanthanum oxynitride, aluminum oxynitride, titanium oxynitride, barium strontium oxynitride, lanthanum aluminum oxy nitride and yttrium oxynitride. Various methods may be used to form the gate dielectric layer 2041, such as a chemical vapor deposition process, a physical vapor deposition process, a flowable chemical vapor deposition process, an atomic layer deposition process, a metal organic deposition process, or a wet chemical process, etc.

The gate layer 2042 may be made of one or more of aluminum, copper, gold, tungsten, tantalum, vanadium, titanium nitride, zirconium nitride, hafnium nitride, vanadium nitride, niobium nitride, tantalum nitride, tungsten nitride, aluminum titanium nitride, tantalum carbide, tantalum magnesium nitride, and tantalum carbo-nitride. Various processes may be used to form the gate layer 2042, such as a chemical vapor deposition process, a physical vapor deposition process, a flowable chemical vapor deposition process, an atomic layer deposition process, a metal organic deposition process, or an electroplating process, etc.

After forming the gate structure 204, a planarization process may be performed on the gate structure 204 to remove an excess portion of gate structure materials. Top surfaces of the source region 2031 and the drain region 2032 may level with a top planarized surface of the gate structure 204 after the planarization process. The planarization process may include a mechanical polishing process, or a chemical mechanical polishing process.

Further, after forming the gate structure 204, a source and a drain may be formed by doping the source region 2031 and the drain region 2032. Various processes may be used to dope the source region 2031 and the drain region 2032, such as an ion implantation process, or a thermal diffusion process.

When the cylindrical third nanowire 2035 with the circular cross-section is used as a channel of a nanowire field-effect transistor, a leakage current may be reduced; and the carrier mobility may be improved. In certain other embodiment, when the third nanowire 2035 with an elliptical cross section or a "Ω" shape cross-section is used as a channel of a nanowire field-effect transistor, a leakage current may also be reduced, and the carrier mobility may also be improved. Further, an anneal time for forming the nanowire field-effect transistor may be relatively short, thus a fabrication process may be simplified.

Thus, a nanowire field-effect transistor may be formed by the above disclosed processes and methods, and the corresponding nanowire field-effect transistor is illustrated in FIG. 11. The nanowire field-effect transistor includes a semiconductor substrate having a first substrate 200 and a buried layer 201. The nanowire field-effect transistor also includes a nanowire 2035 having a circular cross-section. Further, the nanowire field-effect transistor includes a source region 2031 and a drain region 2032. Further, the nanowire field-effect transistor also includes a surrounding gate structure 204 having a gate dielectric layer 2041 and a gate layer 2042. The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a nanowire-based semiconductor structure, comprising:
    forming a first nanowire with a first polygon-shaped cross-section having a first number of sides;
    forming a second nanowire by depositing a semiconductor layer directly on all surface of the first nanowire, such that the semiconductor layer of the second nanowire has a second polygon-shaped cross-section containing the first polygon-shaped cross-section of the first nanowire, the second polygon-shaped cross-section having a second number of sides, the second number being greater than the first number; and
    forming a third nanowire by annealing the second nanowire, comprising the semiconductor layer and the first nanowire, to remove a substantial number of vertexes of the second polygon-shaped cross-section, wherein the third nanowire has a non-polygon-shaped cross-section corresponding to the second polygon-shaped cross-section.

2. The method according to claim 1, wherein:
    the first polygon is a square or a rectangular; the first number is four; and the first nanowire has a (100) crystal face, a (−100) crystal face, a (010) crystal face, and a (0-10) crystal face.

3. The method according to claim 1, wherein:
    the second polygon has a side number greater than five, and the second nanowire at least has a (100) crystal face, a (−100) crystal face, a (010) crystal face, a (0-10) crystal face, a (1-10) crystal face, and a (110) crystal face.

4. The method according to claim 1, wherein:
    the third nanowire has a circular cross-section, or an elliptical cross-section, or a "Ω" shape cross-section.

5. The method according to claim 1, before forming the first nanowire, further including:
    providing a first semiconductor substrate;
    forming a buried layer on the first semiconductor substrate;
    forming a second semiconductor substrate on the buried layer; and
    forming a first nanowire, wherein forming the first nanowire includes:
        etching the second semiconductor substrate to form a source region, a drain region, and the first nanowire, wherein the first nanowire is formed directly on the buried layer.

6. The method according to claim 1, wherein:
    the second nanowire is annealed in a He or $H_2$ or $D_2$ environment with a temperature greater than approximately 900° C.

7. The method according to claim 1, after forming the third nanowire, further including:
    oxidizing surface of the third nanowire; and
    removing the oxide layer to smooth the surface of the third nanowire.

8. The method according to claim 1, wherein:
    the semiconductor layer is formed by a selective epitaxial growth process.

9. The method according to claim 5, wherein:
    the first semiconductor substrate and the second semiconductor substrate are made of one or more of Si, SiGe, SiC, Ge, and III-V semiconductors.

10. The method according to claim 5, after forming the first nanowire, further including:
    removing a portion of the buried layer underneath the first nanowire by etching the buried layer to form a through-hole between the first nanowire and the buried layer to suspend the first nanowire over the buried layer.

11. The method according to claim 5, wherein:
    the first nanowire is formed by a dry etching process.

12. The method according to claim 5, after forming the third nanowire, further including:
    forming a gate structure sequentially having a gate dielectric layer and a gate layer on the third nanowire, wherein the gate dielectric layer covers an entire surface of the third nanowire and the gate layer covers an entire surface of the dielectric layer; and forming a source and a drain by doping the source region and the drain region.

13. The method according to claim 1, wherein:
the second polygon is octagonal and the second nanowire has a (100) crystal face, a (−100) crystal face, a (010) crystal face, a (0-10) crystal face, a (1-10) crystal face, a (110) crystal face, a (−110) crystal face, and a (−1-10) crystal face.

14. The method according to claim 5, wherein:
the source region and drain region are formed in parallel, and the first nanowire is connected to each of the source region and drain region by an extended trapezoid.

* * * * *

UNITED STATES PATENT AND TRADEMARK OFFICE
CERTIFICATE OF CORRECTION

PATENT NO.       : 8,912,545 B2
APPLICATION NO.  : 13/832648
DATED            : December 16, 2014
INVENTOR(S)      : Deyuan Xiao et al.

It is certified that error appears in the above-identified patent and that said Letters Patent is hereby corrected as shown below:

On The Title Page, Item (54) Title should read -- (54) NANOWIRES, NANOWIRE FIELD-EFFECT TRANSISTORS AND FABRICATION METHOD --.

Signed and Sealed this
Third Day of May, 2016

Michelle K. Lee
*Director of the United States Patent and Trademark Office*